(12) United States Patent
Nishio et al.

(10) Patent No.: US 8,396,338 B2
(45) Date of Patent: Mar. 12, 2013

(54) OPTO-ELECTRIC HYBRID MODULE AND METHOD OF MANUFACTURING THE SAME

(75) Inventors: Hajime Nishio, Ibaraki (JP); Masayuki Hodono, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 243 days.

(21) Appl. No.: 12/879,755

(22) Filed: Sep. 10, 2010

(65) Prior Publication Data

US 2011/0064354 A1    Mar. 17, 2011

Related U.S. Application Data

(60) Provisional application No. 61/246,310, filed on Sep. 28, 2009.

(30) Foreign Application Priority Data

Sep. 16, 2009    (JP) .................................. 2009-214915

(51) Int. Cl.
*G02B 6/42* (2006.01)
*H04B 10/12* (2006.01)

(52) U.S. Cl. ............ 385/31; 385/43; 398/139; 398/141; 398/200; 398/214

(58) Field of Classification Search ........................ None
See application file for complete search history.

(56) References Cited

U.S. PATENT DOCUMENTS

| 7,174,057 | B2 | 2/2007 | Shimizu et al. | |
|---|---|---|---|---|
| 2006/0198569 | A1* | 9/2006 | Ohtsu et al. ..................... | 385/14 |
| 2007/0104416 | A1 | 5/2007 | Shimizu et al. | |
| 2009/0274412 | A1 | 11/2009 | Sano et al. | |

FOREIGN PATENT DOCUMENTS

| JP | 2006-017885 A | 1/2006 |
|---|---|---|
| JP | 2007-286289 A | 11/2007 |

OTHER PUBLICATIONS

Japanese Office Action dated Nov. 27, 2012, issued in corresppond-ing Japanese Patent Application No. 2009-214915, with English translation (8 pages).
JP2006-234985 A, English abstract with Machine translation, Cited in Japanese Office Action dated Nov. 27, 2012.
JP2009-003272 A, English abstract with Machine translation, Cited in Japanese Office Action dated Nov. 27, 2012.
JP2007-004101 A, English abstract with Machine translation, Cited in Japanese Office Action dated Nov. 27, 2012.
JP2006-323317 A, English abstract with Machine translation, Cited in Japanese Office Action dated Nov. 27, 2012.

* cited by examiner

*Primary Examiner* — Jerry Rahll
(74) *Attorney, Agent, or Firm* — Westerman, Hattori, Daniels & Adrian, LLP

(57) ABSTRACT

An opto-electric hybrid module capable of shortening the distance between a light-emitting section or a light-receiving section of a semiconductor chip and a reflecting surface formed in a core to reduce optical losses between an opto-electric conversion substrate section and an optical waveguide section, and a method of manufacturing the same. A recessed portion (3*a*) is formed in a surface of an over cladding layer (3) of the optical waveguide section ($W_1$). At least part of the light-emitting section (7*a*) or the light-receiving section of the semiconductor chip (7) for opto-electric conversion and at least part of a loop portion (8*a*) of a bonding wire (8) in the opto-electric conversion substrate section ($E_1$) are positioned within the recessed portion (3*a*). This brings the light-emitting section (7*a*) or the light-receiving section of the semiconductor chip (7) and the reflecting surface (2*a*) formed in the core (2) closer to each other.

6 Claims, 5 Drawing Sheets

F I G. 4A
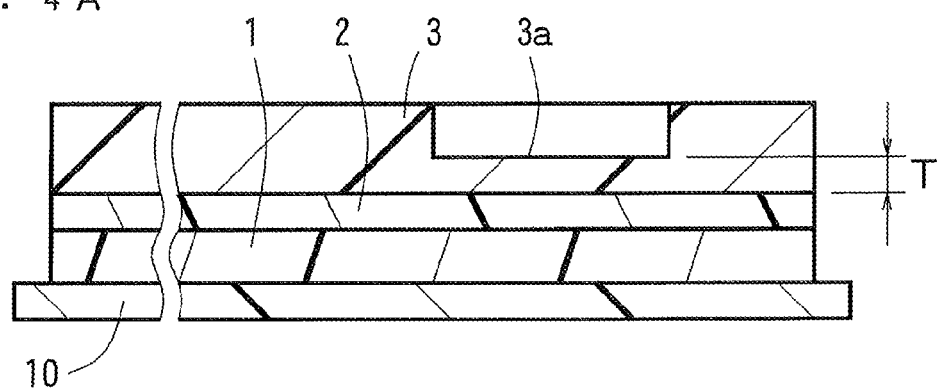
F I G. 4B
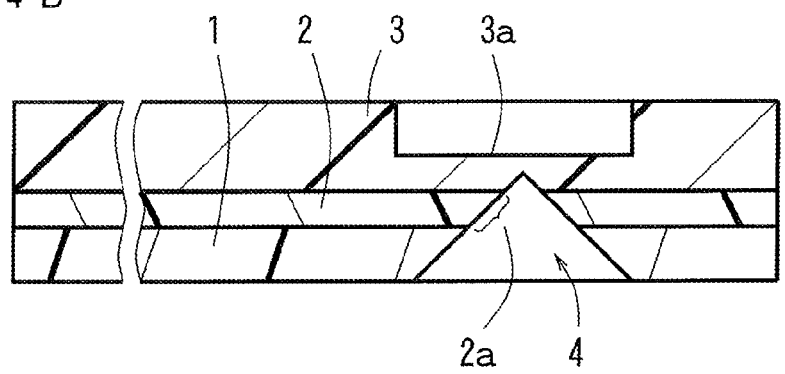

PRIOR ART

OPTO-ELECTRIC HYBRID MODULE AND METHOD OF MANUFACTURING THE SAME

RELATED APPLICATIONS

This application claims the benefit of U.S. Provisional Application No. 61/246,310, filed Sep. 28, 2009, which is hereby incorporated by reference.

BACKGROUND OF THE INVENTION

1. Field of the Invention

The present invention relates to an opto-electric hybrid module including an optical waveguide section and an opto-electric conversion substrate section with a semiconductor chip for opto-electric conversion mounted therein, and to a method of manufacturing the same.

2. Description of the Related Art

As shown in FIG. 6, an opto-electric hybrid module is constructed by individually producing an opto-electric conversion substrate section $E_O$ including a sealing resin portion 69, and an optical waveguide section $W_O$, and then bonding the sealing resin portion 69 of the opto-electric conversion substrate section $E_O$ to a surface of the optical waveguide section $W_O$ with a transparent adhesive layer B therebetween, as disclosed, for example, in Japanese Published Patent Applications Nos. 2006-17885 and 2007-286289. In the opto-electric conversion substrate section $E_O$, a semiconductor chip 67 for opto-electric conversion is mounted on a substrate 65 with an electrode 66 formed thereon, and the semiconductor chip 67 and the electrode 66 are electrically connected to each other with a bonding wire 68. To protect the bonding wire 68, a transparent resin (the sealing resin portion 69) seals the semiconductor chip 67 and the electrode 66 together with the bonding wire 68. In the optical waveguide section $W_O$, on the other hand, a core 62 for transmitting light is sandwiched between an under cladding layer 61 and an over cladding layer 63. A cut 64 of an inverted V shape extending through the core 62 to the over cladding layer 63 at its tip is formed, as shown, in an opposite surface of the under cladding layer 61 from the core 62. The cut 64 has a cut surface provided in the form of a surface inclined at 45 degrees to the axial direction (or the longitudinal direction) of the core 62. Portions of the core 62 intercepted by the cut 64 are exposed or uncovered at the inclined surface, and the inside one of the exposed portions of the core 62 serves as a reflecting surface 62a. The bonding of the opto-electric conversion substrate section $E_O$ and the optical waveguide section $W_O$ is achieved using the transparent adhesive layer B between a surface portion of the over cladding layer 63 corresponding to the reflecting surface 62a in the optical waveguide section $W_O$ and the sealing resin portion 69 in the opto-electric conversion substrate section $E_O$. The semiconductor chip 67 is either a light-emitting element or a light-receiving element including a light-emitting section 67a or a light-receiving section formed on an opposite surface thereof from the substrate 65 (a lower end surface thereof as seen in FIG. 6).

The propagation of a light beam L in the opto-electric hybrid module is done in a manner to be described below. When the semiconductor chip 67 is a light-emitting element, a light beam L is emitted downwardly from the light-emitting section 67a of the semiconductor chip 67. The light beam L passes through the sealing resin portion 69 and the adhesive layer B and then through the over cladding layer 63 of the optical waveguide section $W_O$, and enters the core 62. Subsequently, the light beam L is reflected from the reflecting surface 62a, and travels through the interior of the core 62 in the axial direction. Then, the light beam L exits from a front end surface of the core 62.

On the other hand, when the semiconductor chip 67 is a light-receiving element, a light beam travels in a direction opposite from that described above, although not shown. The light beam enters the core 62 through the front end surface of the core 62. Next, the light beam travels through the interior of the core 62 in the axial direction, and is reflected upwardly from the reflecting surface 62a. Then, the light beam passes through the over cladding layer 63 and then through the adhesive layer B and the sealing resin portion 69, and thereafter is received by the light-receiving section of the semiconductor chip 67.

When the semiconductor chip 67 is the light-emitting element, the light beam L emitted from the light-emitting section 67a of the semiconductor chip 67 diverges in the course of the propagation of the light beam L. For this reason, if there is a long distance D between the light-emitting section 67a of the semiconductor chip 67 and the reflecting surface 62a formed in the core 62, the light beam L diverges widely. As a result, the light beam L deviates away from the reflecting surface 62a and is not guided into the core 62 in some cases. Likewise, when the semiconductor chip 67 is the light-receiving element, the light beam traveling through the interior of the core 62 and reflected from the reflecting surface 62a also diverges. For this reason, the light beam L deviates away from the light-receiving section of the semiconductor chip 67 and is not received by the light-receiving section in some cases. It is therefore necessary to design the opto-electric hybrid module so as to minimize the distance D between the light-emitting section 67a or the light-receiving section of the semiconductor chip 67 and the reflecting surface 62a formed in the core 62.

In the conventional opto-electric hybrid module, however, the sealing resin portion 69 of the opto-electric conversion substrate section $E_O$ is simply stacked and bonded onto the over cladding layer 63 of the optical waveguide section $W_O$ with the adhesive layer B therebetween, as disclosed in Japanese Published Patent Applications Nos. 2006-17885 and 2007-286289. This has been common technical practice. In the opto-electric hybrid module having such a structure, it is impracticable to further shorten the distance D between the light-emitting section 67a or the light-receiving section of the semiconductor chip 67 and the reflecting surface 62a formed in the core 62. In other words, it is impracticable to further reduce optical losses between the opto-electric conversion substrate section $E_O$ and the optical waveguide section $W_O$. The distance D between the lower end surface (the light-emitting section 67a or the light-receiving section) of the semiconductor chip 67 and the center of the reflecting surface 62a (the axis of the core 62) is typically 200 μm or greater.

SUMMARY OF THE INVENTION

The present invention has been made by overcoming such common technical practice. It is therefore an object of the present invention to provide an opto-electric hybrid module capable of shortening the distance between a light-emitting section or a light-receiving section of a semiconductor chip and a reflecting surface formed in a core to reduce optical losses between an opto-electric conversion substrate section and an optical waveguide section, and to provide a method of manufacturing the same.

To accomplish the aforementioned object, a first aspect of the present invention is intended for an opto-electric hybrid module comprising: an optical waveguide section including a core for transmitting a light beam, and a first cladding layer and a second cladding layer sandwiching the core therebetween; and an opto-electric conversion substrate section including a semiconductor chip for opto-electric conversion having one of a light-emitting section and a light-receiving section, an electrode, and a bonding wire electrically connecting the semiconductor chip and the electrode to each other and having a loop portion, the core having a portion provided in the form of a reflecting surface for reflecting a light beam to allow light transmission between the core and the semiconductor chip, the first cladding layer of the optical waveguide section having a recessed portion formed in an opposite surface thereof from the core, at least part of the one of the light-emitting section and the light-receiving section of the semiconductor chip of the opto-electric conversion substrate section being positioned within the recessed portion, at least part of the loop portion of the bonding wire of the opto-electric conversion substrate section being positioned within the recessed portion, the opto-electric conversion substrate section and the optical waveguide section being integrated together, with the positioning performed.

A second aspect of the present invention is intended for a method of manufacturing an opto-electric hybrid module including an optical waveguide section having a core for transmitting a light beam, and a first cladding layer and a second cladding layer sandwiching the core therebetween, and an opto-electric conversion substrate section having a semiconductor chip for opto-electric conversion, an electrode, and a bonding wire electrically connecting the semiconductor chip and the electrode to each other, the core having a portion provided in the form of a reflecting surface for reflecting a light beam to allow light transmission between the core and the semiconductor chip. The method comprises the steps of: forming a recessed portion in an opposite surface of the first cladding layer from the core in the optical waveguide section; positioning at least part of one of a light-emitting section and a light-receiving section of the semiconductor chip of the opto-electric conversion substrate section within the recessed portion, and positioning at least part of a loop portion of the bonding wire of the opto-electric conversion substrate section within the recessed portion; and integrating the opto-electric conversion substrate section and the optical waveguide section together after the positioning step.

In the opto-electric hybrid module according to the present invention, the recessed portion is formed in the opposite surface of the first cladding layer from the core. At least part of the light-emitting section or the light-receiving section of the semiconductor chip of the opto-electric conversion substrate section is positioned within the recessed portion, and at least part of the loop portion of the bonding wire of the opto-electric conversion substrate section is also positioned within the recessed portion. This shortens the distance between the light-emitting section or the light-receiving section of the semiconductor chip of the opto-electric conversion substrate section and the reflecting surface of the optical waveguide section. As a result, when the semiconductor chip is a light-emitting element, the shortening of the distance enables a light beam emitted from the light-emitting section of the semiconductor chip to reach the reflecting surface before the light beam diverges too widely. When the semiconductor chip is a light-receiving element, on the other hand, the shortening of the distance enables a light beam traveling through the interior of the core and reflected from the reflecting surface to be received by the light-receiving section of the semiconductor chip before the light beam diverges too widely. In other words, the opto-electric hybrid module according to the present invention is capable of reducing optical losses between the opto-electric conversion substrate section and the optical waveguide section. Additionally, in the opto-electric hybrid module according to the present invention, at least part of the loop portion of the bonding wire is positioned within the recessed portion of the first cladding layer, as mentioned above. Thus, the bonding wire is protected by the recessed portion of the first cladding layer. This allows the elimination of the need for a conventionally formed sealing resin portion for protecting the bonding wire.

Preferably, the bonding wire, the semiconductor chip and the electrode are not sealed with resin. In this case, the optical losses are further reduced because the light beam does not pass through the sealing resin portion.

In the method of manufacturing the opto-electric hybrid module according to the present invention, the recessed portion is formed in the opposite surface of the first cladding layer from the core. At least part of the light-emitting section or the light-receiving section of the semiconductor chip of the opto-electric conversion substrate section is positioned within the recessed portion, and at least part of the loop portion of the bonding wire of the opto-electric conversion substrate section is also positioned within the recessed portion. This achieves the manufacture of the opto-electric hybrid module in which the distance between the light-emitting section or the light-receiving section of the semiconductor chip of the opto-electric conversion substrate section and the reflecting surface of the optical waveguide section is shortened, whereby optical losses between the opto-electric conversion substrate section and the optical waveguide section are reduced. Also, the manufacture of the opto-electric hybrid module is facilitated because the light-emitting section or the light-receiving section of the semiconductor chip is positioned by using the recessed portion as a guide. Additionally, in the method of manufacturing the opto-electric hybrid module according to the present invention, at least part of the loop portion of the bonding wire is positioned within the recessed portion of the first cladding layer, as mentioned above. Thus, the bonding wire is protected by the recessed portion of the first cladding layer. This allows the elimination of the need for a conventionally formed sealing resin portion for protecting the bonding wire.

Preferably, the recessed portion in the first cladding layer is formed either by laser cutting after the formation of the first cladding layer or by die-molding at the same time as the first cladding layer. This facilitates the formation of the recessed portion.

Preferably, the bonding wire, the semiconductor chip and the electrode are not sealed with resin. This reduces costs required for the formation of the resin sealing portion.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3C, 4A and 4B are illustrations schematically showing the step of producing the optical waveguide section constituting the opto-electric hybrid module.

DETAILED DESCRIPTION

Embodiments according to the present invention will now be described in detail with reference to the drawings.

Figure 1:
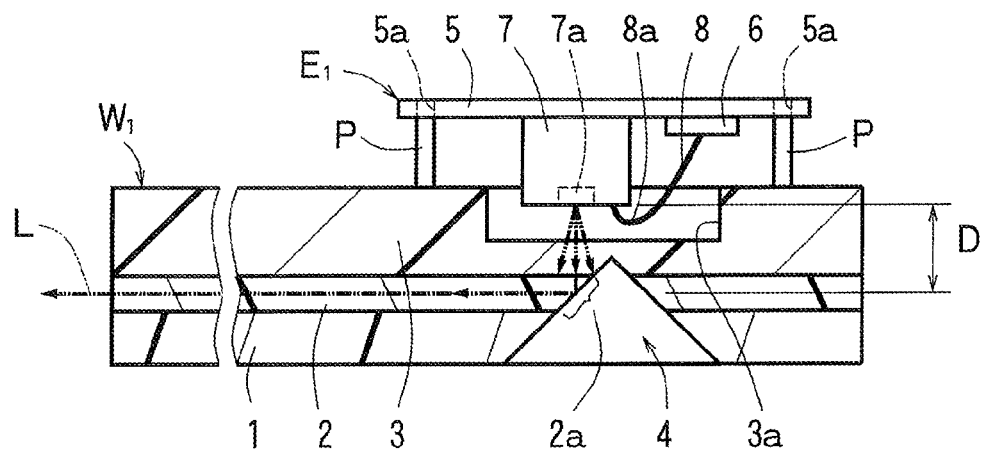
FIG. 1 is an illustration schematically showing an opto-electric hybrid module (with an opto-electric conversion substrate section in side elevation and an optical waveguide section in section) according to an embodiment of the present invention.

FIG. 1 is an illustration schematically showing an opto-electric hybrid module according to one embodiment of the present invention. This opto-electric hybrid module includes an opto-electric conversion substrate section $E_1$ and an optical waveguide section $W_1$. In the opto-electric conversion substrate section $E_1$, a semiconductor chip 7 for opto-electric conversion and an electrode 6 are electrically connected to each other with a bonding wire 8. In the optical waveguide section $W_1$, an over cladding layer (a first cladding layer) 3 has a recessed portion 3a which receives the whole of a light-emitting section 7a or a light-receiving section of the semiconductor chip 7 and a substantial part of a loop portion 8a of the bonding wire 8. The whole of the light-emitting section 7a or the light-receiving section of the semiconductor chip 7 is positioned within the recessed portion 3a of the over cladding layer 3, as mentioned above. A substantial part of the loop portion 8a of the bonding wire 8 is also positioned within the recessed portion 3a of the over cladding layer 3. In that state, the opto-electric conversion substrate section $E_1$ is fixed to the optical waveguide section $W_1$. The formation of the recessed portion 3a brings the semiconductor chip 7 closer to a reflecting surface 2a formed in a core 2. In this embodiment, the fixing of the opto-electric conversion substrate section $E_1$ to the optical waveguide section $W_1$ is achieved by forming through holes 5a in respective corner portions of a substrate 5 in the opto-electric conversion substrate section $E_1$, bringing upper end portions of columns P respectively into fitting engagement with the through holes 5a, and bonding the bottom surfaces of the respective columns P to portions of the over cladding layer 3 surrounding the recessed portion 3a with an adhesive and the like. In FIG. 1, the reference numeral 1 designates an under cladding layer (a second cladding layer), and 4 designates a cut.

More specifically, in the opto-electric conversion substrate section $E_1$, the electrode 6 is formed on the substrate 5 made of silicon and the like, and the semiconductor chip 7 for opto-electric conversion is mounted on the substrate 5. The semiconductor chip 7 and the electrode 6 are electrically connected to each other with the bonding wire 8. The semiconductor chip 7 is either a light-emitting element such as a semiconductor laser or a light-receiving element such as a photodiode. The light-emitting section 7a or the light-receiving section of the semiconductor chip 7 is formed on an opposite surface of the semiconductor chip 7 from the substrate 5 (a lower end surface of the semiconductor chip 7 as seen in FIG. 1). The loop portion 8a of the bonding wire 8 is a curved portion formed near the light-emitting section 7a or the light-receiving section of the semiconductor chip 7. The bonding wire 8, the semiconductor chip 7 and the electrode 6 in this embodiment, unlike those in the related art, are not sealed with resin.

In the optical waveguide section $W_1$, on the other hand, the core 2 for transmitting light is sandwiched between the over cladding layer 3 and the under cladding layer 1. The recessed portion 3a is formed in an opposite surface of the over cladding layer 3 from the core 2. The cut 4 of an inverted V shape extending through the core 2 to the over cladding layer 3 at its tip is formed, as shown, in a position corresponding to the recessed portion 3a in an opposite surface of the under cladding layer 1 from the core 2. The cut 4 has a cut surface provided in the form of a surface inclined at 45 degrees to the axial direction of the core 2. Portions of the core 2 intercepted by the cut 4 are exposed or uncovered at the inclined surface, and the inside one of the exposed portions of the core 2 serves as the reflecting surface 2a.

Figure 6:
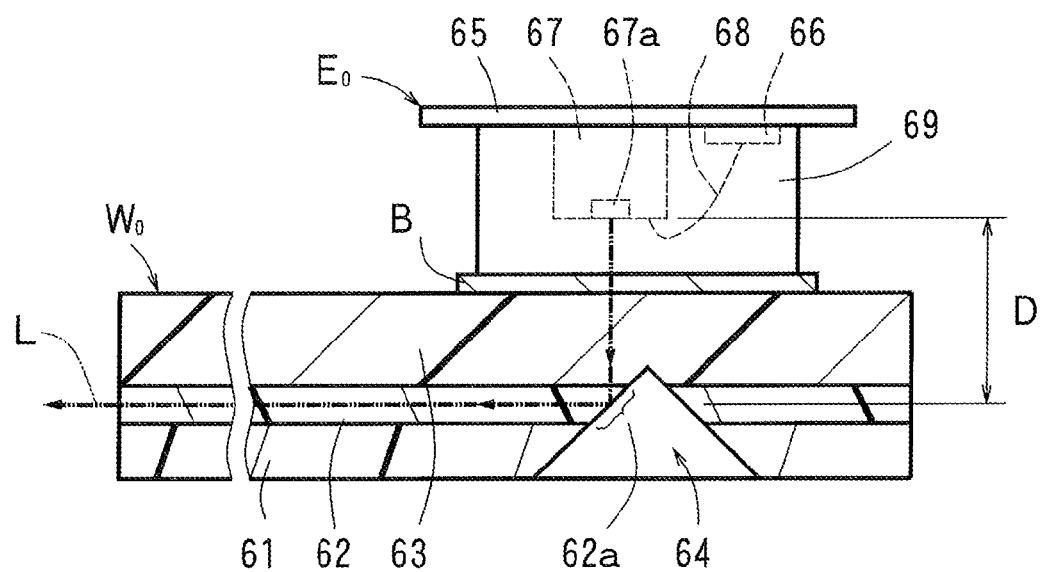
FIG. 6 is a sectional view schematically showing a conventional opto-electric hybrid module.

In the opto-electric hybrid module, as described above, the formation of the recessed portion 3a shortens the distance D between the lower end surface (the light-emitting section 7a or the light-receiving section) of the semiconductor chip 7 and the center of the reflecting surface 2a formed in the core 2 (the axis of the core 2), as compared with the distance D in the conventional opto-electric hybrid module (with reference to FIG. 6). When the semiconductor chip 7 is a light-emitting element, the shortening of the distance D enables a light beam L emitted from the light-emitting section 7a of the semiconductor chip 7 to reach the reflecting surface 2a and to enter the core 2 before the light beam L diverges too widely, as shown in FIG. 1. When the semiconductor chip 7 is a light-receiving element, on the other hand, the shortening of the distance D enables a light beam traveling through the interior of the core 2 and reflected from the reflecting surface 2a to be received by the light-receiving section of the semiconductor chip 7 before the light beam diverges too widely. In other words, the opto-electric hybrid module is reduced in optical losses between the opto-electric conversion substrate section $E_1$ and the optical waveguide section $W_1$.

In the opto-electric hybrid module, as described above, a substantial part of the loop portion 8a of the bonding wire 8 is positioned within the recessed portion 3a of the over cladding layer 3. Thus, the bonding wire 8 is protected by the recessed portion 3a of the over cladding layer 3 without the sealing of the bonding wire 8 with resin. Additionally, since the bonding wire 8 is thus protected, the bonding wire 8 may be brought into contact with the bottom surface of the recessed portion 3a of the over cladding layer 3, in which case the semiconductor chip 7 and the reflecting surface 2a formed in the core 2 are brought closer to each other.

In the opto-electric hybrid module, as described above, the columns P are used to integrate the opto-electric conversion substrate section $E_1$ and the optical waveguide section $W_1$ together without the sealing of the bonding wire 8 with resin. There is hence no danger of damaging the bonding wire 8 due to the pressure of the resin and the like during the sealing with the resin. Additionally, the columns P are easily reduced in size by the cutting thereof. This easily achieves the shortening of the distance D between the lower end surface (the light-emitting section 7a or the light-receiving section) of the semiconductor chip 7 and the reflecting surface 2a formed in the core.

Figure 2:
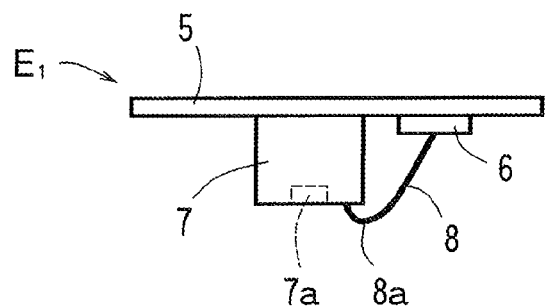
FIG. 2 is a side view schematically showing the opto-electric conversion substrate section constituting the opto-electric hybrid module.
Figure 5A:
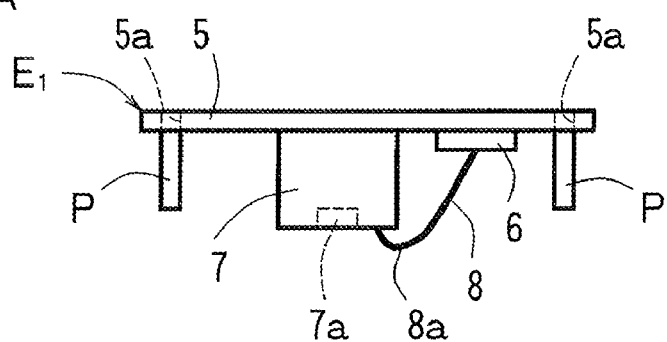
FIGS. 5A and 5B are illustrations schematically showing the step of fixing the opto-electric conversion substrate section to the optical waveguide section.
Figure 5B:
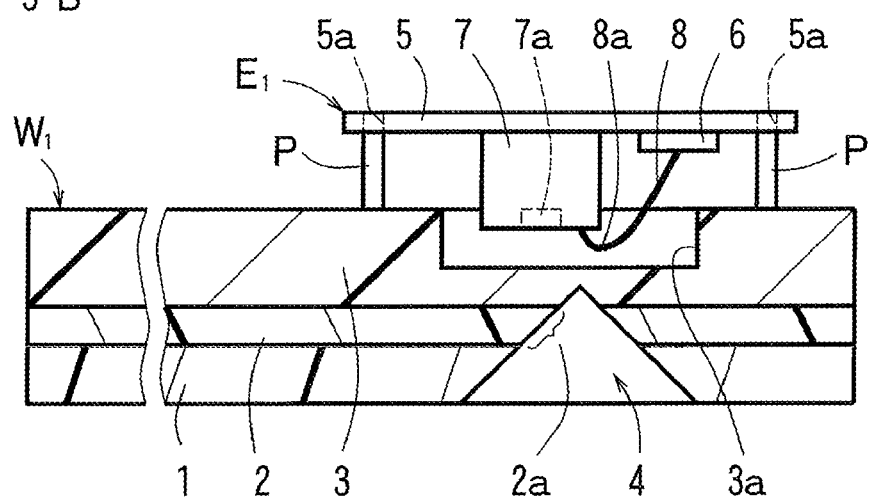

The opto-electric hybrid module is manufactured by undergoing the following process steps of:

(1) preparing the opto-electric conversion substrate section $E_1$ (with reference to FIG. 2);

(2) producing the optical waveguide section $W_1$ (with reference to FIGS. 3A, 3B, 3C, 4A and 4B); and (3) fixing the opto-electric conversion substrate section $E_1$ to the optical waveguide section $W_1$ (with reference to FIGS. 5A and 5B).

The step (1) of preparing the opto-electric conversion substrate section $E_1$ will be described with reference to FIG. 2. As mentioned earlier, the opto-electric conversion substrate section $E_1$ includes the substrate 5 made of silicon and the like, the electrode 6, the semiconductor chip 7 for opto-electric conversion, and the bonding wire 8 for electrically connecting the electrode 6 and the semiconductor chip 7 to each other. The bonding wire 8, the semiconductor chip 7 and the electrode 6 in this embodiment, unlike those in the related art, are not sealed with resin. Such an unsealed opto-electric conversion substrate section $E_1$ is commercially available, for example, from Optowell Co., Ltd.

Next, the step (2) of producing the optical waveguide section $W_1$ will be described. First, a base 10 of a flat shape (with reference to FIG. 3A) for use in the formation of the under cladding layer 1 is prepared. Examples of a material for the formation of the base 10 include glass, quartz, silicon, resin, metal and the like. In particular, a stainless steel substrate is preferable. This is because the stainless steel substrate is excellent in resistance to thermal expansion and contraction so that various dimensions thereof are maintained substantially at their design values in the step of producing the optical waveguide section $W_1$. The thickness of the base 10 is, for example, in the range of 20 μm to 5 mm.

Figure 3A:
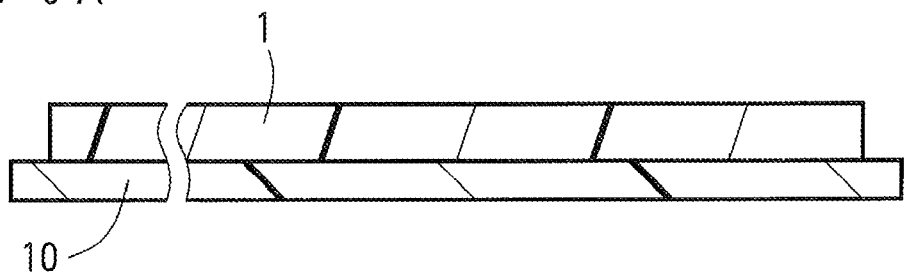

Then, as shown in FIG. 3A, the under cladding layer 1 is formed on a predetermined region of a surface of the base 10. Examples of a material for the formation of the under cladding layer 1 include thermosetting resins and photosensitive resins. When a thermosetting resin is used, a varnish prepared by dissolving the thermosetting resin in a solvent is applied to the base 10 and is then heated to thereby provide the under cladding layer 1. When a photosensitive resin is used, on the other hand, a varnish prepared by dissolving the photosensitive resin in a solvent is applied to the base 10 and is then exposed to irradiation light such as ultraviolet light to thereby provide the under cladding layer 1. The thickness of the under cladding layer 1 is preferably in the range of 10 to 50 μm.

Figure 3B:
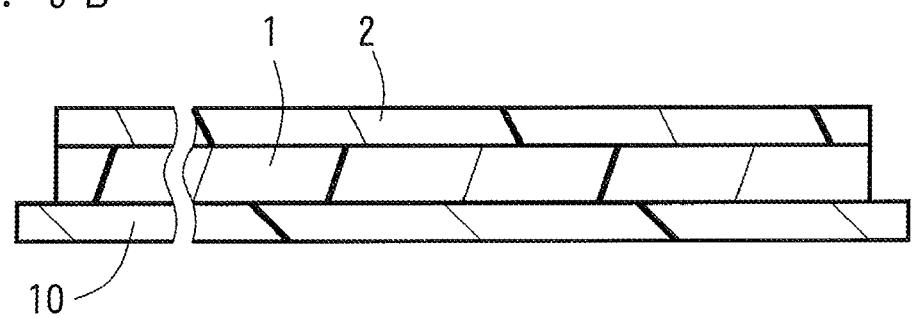

Next, as shown in FIG. 3B, the core 2 having a predetermined pattern is formed on a surface of the under cladding layer 1 by a photolithographic process. Preferably, a photosensitive resin excellent in patterning characteristics is used as a material for the formation of the core 2. Examples of the photosensitive resin include acrylic based ultraviolet curable resins, epoxy based ultraviolet curable resins, siloxane based ultraviolet curable resins, norbornene based ultraviolet curable resins, and polyimide based ultraviolet curable resins. Examples of the sectional configuration of the core 2 include a trapezoid and a rectangle having excellent patterning characteristics. The width of the core 2 is preferably in the range of 10 to 500 μm. The thickness (height) of the core 2 is preferably in the range of 30 to 100 μm.

The material for the formation of the core 2 used herein has a refractive index greater than that of the material for the formation of the under cladding layer 1 described above and the over cladding layer 3 to be described below (with reference to FIG. 3C), and is highly transparent to the wavelength of the light beam to be propagated. The refractive index is adjusted by changing at least one of the type and content (the type and/or content) of an organic group introduced into the resins that are the materials for the formation of the under cladding layer 1, the core 2 and the over cladding layer 3. As an example, the refractive index is increased by introducing a cyclic aromatic group (e.g., a phenyl group) into resin molecules or by increasing the content of the aromatic group in the resin molecules. On the other hand, the refractive index is decreased by introducing a straight-chain or cyclic aliphatic group (e.g., a methyl group and a norbornene group) into the resin molecules or by increasing the content of the aliphatic group in the resin molecules.

Figure 3C:
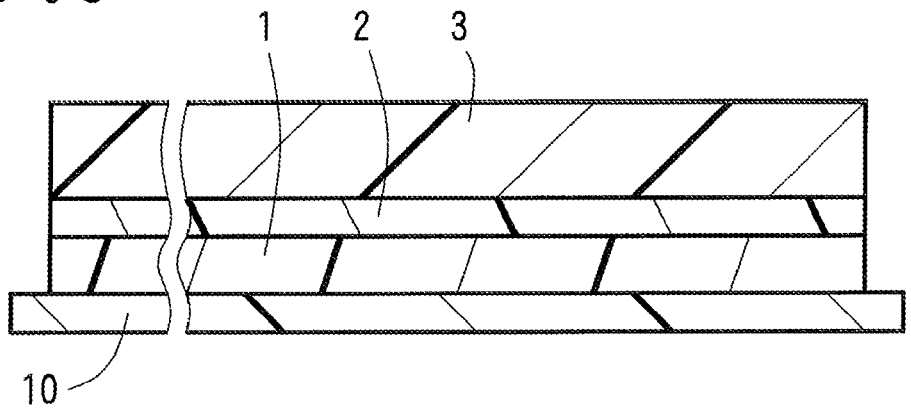

Next, as shown in FIG. 3C, the over cladding layer 3 is formed so as to cover the core 2. Examples of a material for the formation of the over cladding layer 3 used herein include thermosetting resins and photosensitive resins similar to those for the under cladding layer 1. The over cladding layer 3 is formed in a manner similar to that of the under cladding layer 1. The thickness of the over cladding layer 3 (as measured from the top surface of the core 2) is preferably in the range of 25 to 1500 μm.

Then, as shown in FIG. 4A, the recessed portion 3a is formed in the opposite surface (the upper surface as seen in FIG. 4A) of the over cladding layer 3 from the core 2 by laser cutting and the like. The opening and bottom surface of the recessed portion 3a are configured to receive the whole of the light-emitting section 7a or the light-receiving section of the semiconductor chip 7 and the substantial part of the loop portion 8a of the bonding wire 8 in the opto-electric conversion substrate section $E_1$ (with reference to FIG. 1). The bottom surface of the recessed portion 3a is shown flat in FIG. 4A, but may be of a U-shaped or other configuration. The thickness T of a portion (the thinnest portion) of the over cladding layer 3 lying between the bottom surface (the lowermost surface) of the recessed portion 3a and the top surface of the core 2 is preferably not greater than 10 μm, and more preferably in the range of 1 to 5 μm. The depth of the recessed portion 3a is determined as appropriate in accordance with the thickness of the over cladding layer 3 so that the thickness T of the thinnest portion takes a predetermined value falling within the aforementioned range.

Next, as shown in FIG. 4B, the base 10 (with reference to FIG. 4A) is stripped from the under cladding layer 1. Then, the cut 4 of the inverted V shape extending through the core 2 to the over cladding layer 3 at its tip is formed in the position corresponding to the recessed portion 3a of the over cladding layer 3 in the opposite surface (the lower surface as seen in FIG. 4B) of the under cladding layer 1 from the core 2. In the process of forming the cut 4, the cut surface is provided in the form of the surface inclined at 45 degrees to the axial direction of the core 2. Also, the portions of the core 2 intercepted by the cut 4 are exposed or uncovered at the inclined surface, and the inside one of the exposed portions of the core 2 is formed as the reflecting surface 2a. Examples of the method of forming the cut 4 include cutting with a dicing blade including a V-shaped edge having an included angle of 90 degrees, and laser cutting. The cut 4 of the inverted V shape preferably does not extend through the over cladding layer 3. If the cut 4 extends through the over cladding layer 3, a portion (for example, a right-hand portion as seen in FIG. 4B) of the optical waveguide section $W_1$ is cut and removed. This reduces the area in which the opto-electric conversion substrate section $E_1$ (with reference to FIG. 5B) is to be fixed in the subsequent step to cause difficulties in fixing the opto-electric conversion substrate section $E_1$. In this manner, the step (2) of producing the optical waveguide section $W_1$ is completed.

Next, the step (3) of fixing the opto-electric conversion substrate section $E_1$ to the optical waveguide section $W_1$ will be described. In this embodiment, the through holes 5a are formed in the respective corner portions of the substrate 5 of the opto-electric conversion substrate section $E_1$, and the upper end portions of the columns P respectively are brought into fitting engagement with the through holes 5a, as shown in FIG. 5A. The columns P are positioned on a surface of the substrate 5 where the semiconductor chip 7 is mounted so as to protrude therefrom. The protrusion length of the columns P is less than that of the semiconductor chip 7.

Then, as shown in FIG. 5B, the light-emitting section 7a or the light-receiving section of the semiconductor chip 7 of the opto-electric conversion substrate section $E_1$ is placed to face toward the reflecting surface 2a of the optical waveguide section $W_1$. The light-emitting section 7a or the light-receiving section of the semiconductor chip 7 is positioned within the recessed portion 3a of the over cladding layer 3, and part of the loop portion 8a of the bonding wire 8 is positioned therewithin. Then, the bottom surfaces of the columns P in the opto-electric conversion substrate section $E_1$ are fixed to the portions of the over cladding layer 3 surrounding the recessed portion 3a with an adhesive and the like. In this manner, the step (3) of fixing the opto-electric conversion substrate section $E_1$ to the optical waveguide section $W_1$ is completed.

In the embodiment described above, the whole of the light-emitting section 7a or the light-receiving section of the semiconductor chip 7 and the substantial part of the loop portion 8a of the bonding wire 8 are positioned within the recessed portion 3a of the over cladding layer 3. However, only at least part of the light-emitting section 7a or the light-receiving section of the semiconductor chip 7 and at least part of the loop portion 8a of the bonding wire 8 are required to be positioned within the recessed portion 3a. Of course, the whole of the semiconductor chip 7 and the whole of the bonding wire 8 may be positioned within the recessed portion 3a.

In the embodiment described above, the recessed portion 3a is formed in the over cladding layer 3, and thereafter the cut 4 of the inverted V shape is formed in the under cladding layer 1. However, the step of forming the recessed portion 3a and the step of forming the cut 4 may be executed either in the reverse order or at the same time.

In the embodiment described above, the recessed portion 3a of the over cladding layer 3 is formed by laser cutting and the like after the over cladding layer 3 is formed. However, the recessed portion 3a may be formed at the same time as the over cladding layer by die-molding.

In the embodiment described above, the columns P are provided in the opto-electric conversion substrate section $E_1$ as a means for fixing the opto-electric conversion substrate section $E_1$. In place of the columns P, a frame may be provided along the periphery of the substrate 5. Alternatively, protrusions corresponding to the columns P and made of the same material as the over cladding layer 3 may be formed integrally with the over cladding layer 3 in the step of forming the over cladding layer 3 by die-molding. In this case, a molding die having depressions for the formation of the protrusions is used.

The opto-electric conversion substrate section $E_1$ in the embodiment described above is unsealed, but may be sealed with resin. In that case, the opto-electric conversion substrate section $E_1$ may be sealed so that a seal conforms to the shape of the recessed portion 3a of the over cladding layer 3, and thereafter be fixed to the optical waveguide section $W_1$. Alternatively, the opto-electric conversion substrate section $E_1$ may be fixed to the optical waveguide section $W_1$, and thereafter the gap therebetween be filled with resin. In the former case, the fixing is done after the sealing. Thus, the semiconductor chip 7 is protected during the fixing process, and the semiconductor chip 7 is prevented from dropping off the substrate 5. In the latter case, the sealing is done after the fixing. This provides adhesion between the surface of the recessed portion 3a and the surface of the sealing resin to achieve the firm fixing of the opto-electric conversion substrate section $E_1$.

Next, an inventive example of the present invention will be described in conjunction with a conventional example. It should be noted that the present invention is not limited to the inventive example.

EXAMPLES

Inventive Example

Material for Formation of Under Cladding Layer and Over Cladding Layer

A material for the formation of an under cladding layer and an over cladding layer was prepared by mixing 100 parts by weight of an epoxy based ultraviolet curable resin having an alicyclic skeleton (EP4080E available from ADEKA Corporation) (component A), and 2 parts by weight of a photo-acid generator (CPI-200K available from San-Apro Ltd.) (component B) together.

Material for Formation of Core

A material for the formation of a core was prepared by mixing 40 parts by weight of an epoxy based ultraviolet curable resin having a fluorene skeleton (OGSOL EG available from Osaka Gas Chemicals Co., Ltd.) (component C), 30 parts by weight of an epoxy based ultraviolet curable resin having a fluorene skeleton (EX-1040 available from Nagase ChemteX Corporation) (component D), 30 parts by weight of 1,3,3-tris{4-[2-(3-oxetanyl)]butoxyphenyl}butane (component E), one part by weight of the aforementioned component B, and 41 parts by weight of ethyl lactate together.

Preparation of Opto-Electric Conversion Substrate Section

An unsealed opto-electric conversion substrate section (available from Optowell Co., Ltd. under the trade name of SM85-2N001) was purchased in which a semiconductor laser (a light-emitting element) was electrically connected to an electrode with a bonding wire.

Production of Optical Waveguide Section

First, the material for the formation of the under cladding layer was applied to a surface of a stainless steel substrate with an applicator. Thereafter, the applied material was exposed to ultraviolet light irradiation. This formed the under cladding layer having a thickness of 20 μm (with a refractive index of 1.510 at a wavelength of 830 nm).

Then, the material for the formation of the core was applied to a surface of the under cladding layer with an applicator. Thereafter, a drying process was performed on the applied material to form a photosensitive resin layer. Next, the photosensitive resin layer was exposed to ultraviolet light irradiation through a photomask formed with an opening pattern identical in shape with the pattern of the core. Thereafter, a heating treatment was performed. Next, development was performed using a developing solution to dissolve away unexposed portions of the photosensitive resin layer. Thereafter, a heating treatment was performed. This formed the core of a rectangular sectional configuration having a width of 20 μm and a height of 50 μm (with a refractive index of 1.592 at a wavelength of 830 nm).

Next, the material for the formation of the over cladding layer was applied to the surface of the under cladding layer with an applicator so as to cover the core. Thereafter, the applied material was exposed to ultraviolet light irradiation. This formed the over cladding layer having a thickness of 1000 μm as measured from the top surface of the core (with a refractive index of 1.510 at a wavelength of 830 nm). Then, a recessed portion having a depth of 990 μm was formed in a surface of the over cladding layer (an opposite surface thereof from the core) by laser cutting so that a portion of the over cladding layer lying between the bottom surface of the recessed portion and the top surface of the core had a thickness of 10 μm.

Thereafter, the stainless steel substrate was stripped from the back surface of the under cladding layer. Then, a cut of an inverted V shape was formed in a position corresponding to the recessed portion of the over cladding layer in the back surface of the under cladding layer (the opposite surface from the core) by cutting with a dicing blade including a V-shaped edge having an included angle of 90 degrees. Thus, portions of the core intercepted by the cut were exposed or uncovered at the cut surface (a surface inclined at 45 degrees to the axial direction of the core) of the cut, and the inside one of the exposed portions of the core was formed as a reflecting surface. The tip of the cut of the inverted V shape was positioned between the bottom surface of the recessed portion of the over cladding layer and the top surface of the core. In this manner, an optical waveguide section was produced.

Manufacture of Opto-Electric Hybrid Module

First, holes were formed in respective corner portions of a substrate in the opto-electric conversion substrate section, and the upper end portions of respective columns made of the same material as the over cladding layer were brought into fitting engagement with the holes, respectively. Then, a light-emitting section of the semiconductor laser of the opto-electric conversion substrate section was placed to face toward the reflecting surface of the optical waveguide section. The light-emitting section of the semiconductor laser was positioned within the recessed portion of the over cladding layer, and part of a loop portion of the bonding wire was positioned therewithin. This positioning was performed by using a self-aligning machine in the following manner. While the position of the opto-electric conversion substrate section was changed, with light emitted from the light-emitting section of the semiconductor laser, the amount of light emitted outwardly from a front end surface of the core after being reflected from the reflecting surface was monitored. Then, the position of the opto-electric conversion substrate section in which the amount of light was maximum was determined. With the opto-electric conversion substrate section so positioned, the bottom surfaces of the respective columns of the opto-electric conversion substrate section were fixed to portions of the over cladding layer surrounding the recessed portion with an adhesive. In this manner, an opto-electric hybrid module was manufactured.

Conventional Example

The bonding wire, the semiconductor laser, and the electrode in the opto-electric conversion substrate section in Inventive Example described above were sealed with a transparent resin. The over cladding layer in the optical waveguide section had no recessed portion. Then, a sealing resin portion of the opto-electric conversion substrate section was bonded to a surface portion of the over cladding layer of the optical waveguide section with a transparent adhesive layer therebetween. Except for these differences, an opto-electric hybrid module in Conventional Example was manufactured in a manner similar to that in Inventive Example described above.

Distance from Light-Emitting Section (Lower End Surface) of Semiconductor Laser to Axis of Core (Center of Reflecting Surface)

The distance from the light-emitting section (the lower end surface) of the semiconductor laser to the axis of the core (the center of the reflecting surface) was 60 μm in Inventive Example, and 200 μm in Conventional Example.

Optical Loss

A driver for driving the opto-electric conversion substrate section was connected to the opto-electric conversion substrate section of each of the opto-electric hybrid modules in Inventive and Conventional Examples. Then, infrared light was emitted from the light-emitting section of the semiconductor laser. The infrared light reflected from the reflecting surface of the optical waveguide section and then emitted outwardly from the front end surface of the core was converged by a convex lens. The intensity of the converged infrared light was measured with a power meter (OPTICAL SENSOR Q 82214 available from Advantest Corporation). Then, an optical loss was calculated from $$\text{Optical Loss(dB)}=-10\ \text{Log}(P_{out}/P_{in}) \quad (1)$$

where $P_{out}$ was the output intensity of the semiconductor laser in μW, and $P_{in}$ was the measured intensity of the emitted infrared light in μW.

As a result, the optical loss was 2.5 dB in Inventive Example, and 3.1 dB in Conventional Example. The result showed that the optical loss in Inventive Example was less than that in Conventional Example.

A result similar to that in Inventive Example was achieved when the recessed portion was formed in the over cladding layer by die-molding at the same time as the over cladding layer, instead of laser cutting as in Inventive Example.

Measurement of Refractive Index

The refractive indices of the under cladding layer, the core and the over cladding layer in the opto-electric hybrid module were measured in the following manner. The materials for the formation of the under cladding layer (the over cladding layer) and the core were deposited on a silicon wafer by spin coating to produce respective samples for the measurement of the refractive indices. The refractive indices of the respective samples were measured using a prism coupler (SPA-4000 available from Sairon Technology, Inc.).

Measurement of Dimensions

The dimensions of the core, the recessed portion of the over cladding layer and the like in the opto-electric hybrid module were measured in the following manner. The manufactured opto-electric hybrid module was cut using a dicing type cutting machine (DAD522 available from Disco Corporation). The dimensions at the resulting cut surface were measured using a laser microscope (available from Keyence Corporation).

The opto-electric hybrid module according to the present invention may be used for detection means for detecting a finger touch position and the like on a touch panel, or information communications devices and signal processors for transmitting and processing digital signals representing sound, images and the like at high speeds.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid module comprising:
   an optical waveguide section including a core for transmitting a light beam, and a first cladding layer and a second cladding layer sandwiching the core therebetween; and
   an opto-electric conversion substrate section including a semiconductor chip for opto-electric conversion having one of a light-emitting section and a light-receiving section, an electrode, and a bonding wire electrically connecting the semiconductor chip and the electrode to each other and having a loop portion,
   the core having a portion provided in the form of a reflecting surface for reflecting a light beam to allow light transmission between the core and the semiconductor chip, the first cladding layer of the optical waveguide section having a recessed portion formed in an opposite surface thereof from the core, at least part of the one of the light-emitting section and the light-receiving section of the semiconductor chip of the opto-electric conversion substrate section being positioned within the recessed portion, at least part of the loop portion of the bonding wire of the opto-electric conversion substrate section being positioned within the recessed portion, the opto-electric conversion substrate section and the optical waveguide section being integrated together.

2. The opto-electric hybrid module according to claim 1, wherein the bonding wire, the semiconductor chip and the electrode are not sealed with resin.

3. A method of manufacturing an opto-electric hybrid module, comprising the steps of:
   (a) preparing an opto-electric conversion substrate section including a semiconductor chip for opto-electric conversion, an electrode, and a bonding wire electrically connecting the semiconductor chip and the electrode to each other;
   (b) producing an optical waveguide section; and
   (c) fixing the opto-electric conversion substrate section to the optical waveguide section, said step (b) including the substeps of (b-1) forming a first cladding layer, a core for transmitting a light beam, and a second cladding layer so that the first and second cladding layers sandwich the core therebetween, (b-2) forming a recessed portion in an opposite surface of the first cladding layer from the core, and (b-3) forming a reflecting surface in a portion of the core, the reflecting surface reflecting a light beam to allow light transmission between the core and the semiconductor chip, said step (c) including the substeps of (c-1) positioning at least part of one of a light-emitting section and a light-receiving section of the semiconductor chip of the opto-electric conversion substrate section within the recessed portion, and positioning at least part of a loop portion of the bonding wire of the opto-electric conversion substrate section within the recessed portion, and (c-2) integrating the opto-electric conversion substrate section and the optical waveguide section together after the step (c-1).

4. The method according to claim 3, wherein the recessed portion in the first cladding layer is formed either by laser cutting after the formation of the first cladding layer or by die-molding at the same time as the formation of the first cladding layer.

5. The method according to claim 3, wherein the bonding wire, the semiconductor chip and the electrode are not sealed with resin.

6. The method according to claim 4, wherein the bonding wire, the semiconductor chip and the electrode are not sealed with resin.

\* \* \* \* \*